United States Patent
Srinivasan et al.

(10) Patent No.: US 10,418,098 B2
(45) Date of Patent: Sep. 17, 2019

(54) METHODS AND SYSTEMS FOR PERFORMING A CALCULATION ACROSS A MEMORY ARRAY

(71) Applicant: Intel Corporation, Santa Clara, CA (US)

(72) Inventors: Srikanth T. Srinivasan, Portland, OR (US); Shigeki Tomishima, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/857,340

(22) Filed: Dec. 28, 2017

(65) Prior Publication Data

US 2019/0043572 A1    Feb. 7, 2019

(51) Int. Cl.
| | |
|---|---|
| G11C 11/00 | (2006.01) |
| G11C 13/00 | (2006.01) |
| G11C 11/54 | (2006.01) |
| G06F 17/16 | (2006.01) |
| G06N 3/063 | (2006.01) |
| H03M 1/12 | (2006.01) |

(52) U.S. Cl.
CPC .......... *G11C 13/0026* (2013.01); *G06F 17/16* (2013.01); *G06N 3/0635* (2013.01); *G11C 11/54* (2013.01); *G11C 13/0028* (2013.01); *H03M 1/12* (2013.01); *G11C 2013/0045* (2013.01)

(58) Field of Classification Search
CPC ................................................................
G11C 13/0026; G11C 11/54; G11C 13/0028; G11C 2013/004; G06F 17/16
See application file for complete search history.

(56) References Cited

U.S. PATENT DOCUMENTS

| | | | | |
|---|---|---|---|---|
| 7,027,342 B2* | 4/2006 | Inoue | ...................... | G11C 8/08 |
| | | | | 365/148 |
| 7,633,809 B2* | 12/2009 | Kajiyama | .............. | G11C 7/065 |
| | | | | 365/185.24 |
| 8,223,530 B2* | 7/2012 | Kitagawa | ........... | G11C 13/0009 |
| | | | | 365/148 |

(Continued)

FOREIGN PATENT DOCUMENTS

| | | |
|---|---|---|
| WO | WO 2016099438 A1 | 6/2016 |
| WO | WO 2017105517 A1 | 6/2017 |

OTHER PUBLICATIONS

Chakrabari et al.; "A Multiply-Add Engine with Monolithically Integrated 3D Memristor Crossbar / CMOS Hybrid Circuit;" Scientific Reports; (Feb. 14, 2017); 10 pages; vol. 7, No. 42429; <doi: 10 .1038/srep42429 >.

(Continued)

*Primary Examiner* — Pho M Luu
(74) *Attorney, Agent, or Firm* — Thorpe North & Western, LLP

(57) ABSTRACT

Devices for computing the sum of multiple Vector-Vector Dot-Products (VVDP) or multiple partial sums of VVDP can include a resistive memory array and a reduction circuit. The reduction circuit can be configured to determine a sum of a selected one or more of a plurality of bit lines of the resistive memory array. A VVDP reduction can be determined from the sum of the selected one or more of the plurality of bit lines.

25 Claims, 6 Drawing Sheets

(56) References Cited

U.S. PATENT DOCUMENTS 9,536,584 B2 * 1/2017 Nebashi ................. H03K 19/18
2016/0133321 A1 5/2016 Nagey

OTHER PUBLICATIONS

Manem et al.; "Design Considerations for Variation Tolerant Multilevel CMOS/Nano Memristor Memory;" Proceedings of the 20$^{th}$ Symposium on Great Lakes Symposium on VLSI, GLSVLSI 2010; (May 16-18, 2010); pp. 287-292; <doi: 10.1145/1785481.1785548 >.

Sun et al.; "Energy-Efficient SQL Query Exploiting RRAM-Based Process-In-Memory Structure;" In: 2017 IEEE 6$^{th}$ Non-Volatile Memory Systems and Applications Symposium (NVMSA); (Aug. 16-18, 2017); <doi: 10.1109/NVMSA2017.8064463 >.

European Search Report dated Jun. 4, 2019, in EP Application No. 18209022.5, filed Nov. 28, 2018; 3 pages.

\* cited by examiner

METHODS AND SYSTEMS FOR PERFORMING A CALCULATION ACROSS A MEMORY ARRAY

BACKGROUND

Computing device machine learning applications can compute large numbers of Vector-Vector Dot-Products (VVDP). Such large numbers of VVDP computations can incur a corresponding large number of memory accesses to store inputs, store intermediate values, calculate reductions, store reduction values, and the like. The large number of memory accesses associated with computing VVDP can incur substantial memory access delays and/or consume substantially high amounts of power transferring data between processing units and memory, which can create a high computing load on the system.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

DESCRIPTION OF EMBODIMENTS

Figure 1:
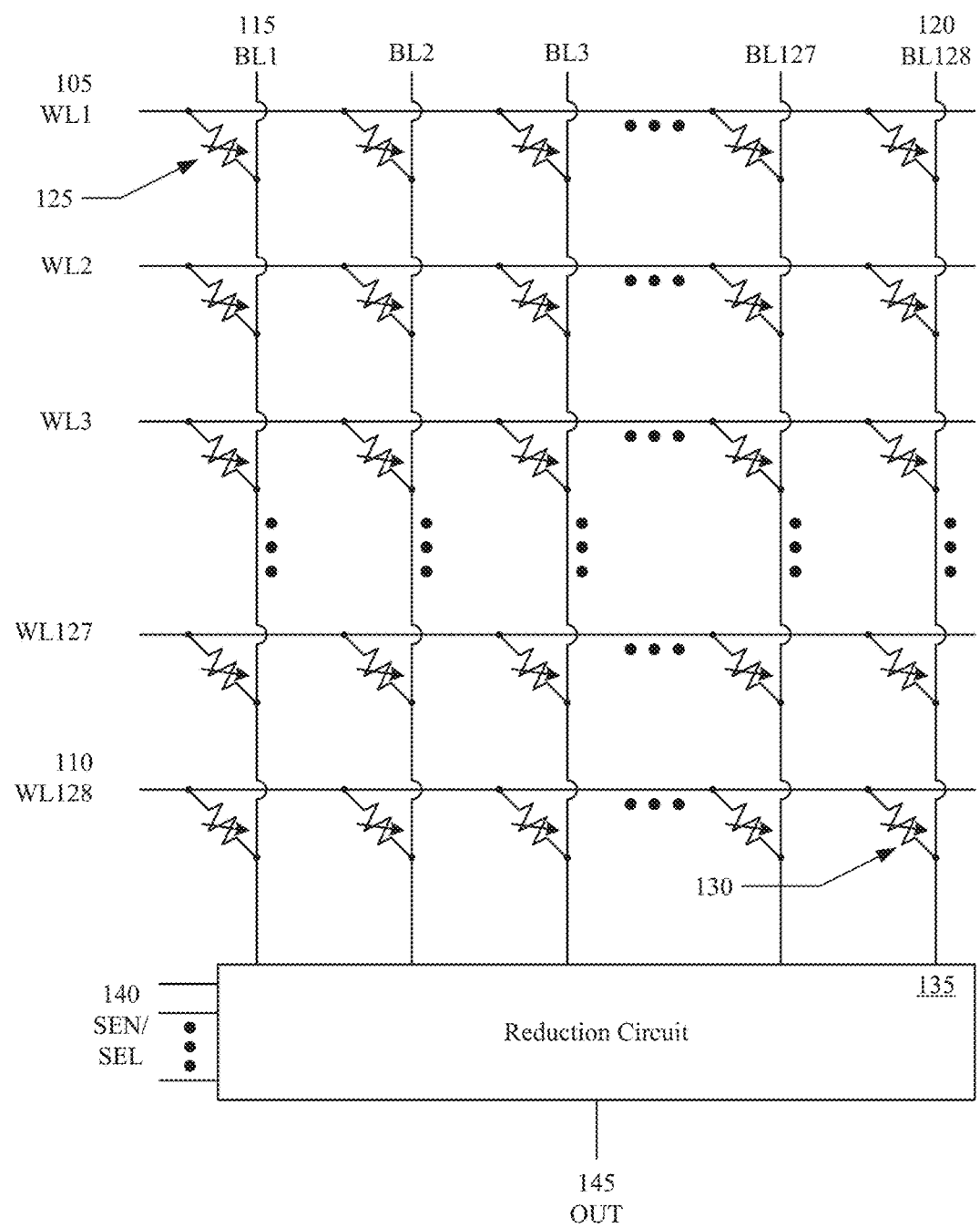
FIG. 1 is a diagram illustrating a computing device programmable media in accordance with an example.

Before embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a" includes a plurality of such.

Reference throughout this specification to "an example" means that a particular feature, structure, or characteristic described in connection with the example is included in one or more embodiments. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), an input device, and an output device. The volatile and non-volatile memory and/or storage elements may be a random-access memory (RAM), erasable programmable read only memory (EPROM), flash drive, optical drive, magnetic hard drive, solid state drive, or other medium for storing electronic data. One or more programs that may implement or utilize the various techniques described herein may use an application programming interface (API), reusable controls, and the like. Such programs may be implemented in a high-level procedural or object-oriented programming language to communicate with a computer system. However, the program(s) may be implemented in assembly or machine language, if desired. In any case, the language may be a compiled or interpreted language, and combined with hardware implementations.

As used herein, the term "processor" can include a single processor or multiple processors, including single core processors and multi-core processors. A processor can include general purpose processors, specialized processors such as central processing units (CPUs), graphics processing units (GPUs), digital signal processors (DSPs), microcontrollers (MCUs), embedded controller (ECs), embedded processors, field programmable gate arrays (FPGAs), network processors, hand-held or mobile processors, application-specific instruction set processors (ASIPs), application-specific integrated circuit processors (ASICs), co-processors, and the like. Additionally, a processor can be packaged in numerous configurations, which is not limiting. For example, a processor can be packaged in a common processor package, a multi-core processor package, a system-on-chip (SoC) package, a system-in-package (SiP) package, a system-on-package (SOP) package, and the like.

Reference throughout this specification to "an example" or "exemplary" means that a particular feature, structure, or characteristic described in connection with the example is included in one or more embodiments of the present technology. Thus, appearances of the phrases "in an example" or "in an embodiment" or the word "exemplary" in various places throughout this specification are not necessarily all referring to the same embodiment.

Example Embodiments

An initial overview of technology embodiments is provided below, and then specific technology embodiments are described in further detail later. This initial summary is intended to aid readers in understanding the technology more quickly but is not intended to identify key features or essential features of the technology nor is it intended to limit the scope of the claimed subject matter.

Vector-Vector Dot-Products (VVDP) are commonly calculated in a variety of applications for a variety of purposes. In one nonlimiting example, VVDP are calculated in machine learning applications to learn useful features for solving problems. In one specific example, a reduction of VVDP can be determined in the analog domain in a computing device programmable media. The computing device programmable media can include a resistive element array, a plurality of bit line select elements and a sense circuit. The resistive element array can include a plurality of word lines, a plurality of bit lines, and a plurality of programmable resistive elements coupled between the plurality of word lines and the plurality of bit lines.

In some examples, the resistive elements can be programmed to any of a plurality of resistive values. Additionally, the plurality of bit line select elements can be configured to couple one or more of the plurality of bit lines to a current summing node in response to one or more of a plurality of bit line sense signals. The sense circuit can be configured to sense a parameter of the current summing node in response to a node sense signal.

In one example, the resistive element array can be programmed based on values of a weight matrix. Voltages can be applied to one or more of the plurality of word lines and/or bit lines based on values of a first vector. One or more of the plurality of bit lines of the resistive element array can be selected based on values of a second vector. A reduction value based on the sum of the selected one or more of the plurality of bit lines can thereby be determined.

FIG. 1 is a diagram illustrating a computing device programmable media in accordance with an example. The computing device programmable media may be a separate apparatus, such as an accelerator, or integral to another device or system, such as a Random-Access Memory (RAM). The computing device programmable media can include a resistive element array 105-130 and a reduction circuit 135. The resistive element array can include a plurality of word lines 105-110, a plurality of bit lines 115-120, and a plurality of programmable resistive elements 125-130 coupled between the plurality of word lines 105-110 and the plurality of bit lines 115-120.

In one implementation, the resistive element array can be a Single Level Cell (SLC) that can store one bit of data, or a Multi-Level Cell (MLC) that can store two or more bits of data. In one implementation, the resistive element array can be any type of byte-accessible memory capable of being used to calculate VVDP. Nonlimiting examples can include phase change memory (PCM), such as chalcogenide glass PCM, planar or 3D PCM, cross-point array memory, including 3D cross-point memory, non-volatile dual in-line memory module (NVDIMM)-based memory, such as persistent memory-based (NVDIMM-P) memory, 3D cross-point-based NVDIMM memory, resistive RAM (ReRAM), including metal-oxide- or oxygen vacancy-based ReRAM, such as $HfO_2$-, $Hf/HfO_x$-, $Ti/HfO_2$-, $TiO_x$-, and $TaO_x$-based ReRAM, filament-based ReRAM, such as $Ag/GeS_2$-, ZrTe/$Al_2O_3$-, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAM (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like.

The reduction circuit 135 can be configured to select one or more of a plurality of bit lines in response to one or more node select sense signals 140. The reduction circuit 135 can be configured to output a reduction value 145 based on a sensed a sum of the selected one or more of the plurality of bit lines. In one implementation, the reduction value can be output to one or more computational units, such as a processor. In another implementation, outputting the reduction value can include saving the reduction value back to the resistive element array, or saving the reduction value in another resistive element array.

In one implementation, the computing device programmable media can be utilized to computer reductions of Vector-Vector Dot-Products (VVDP). The resistive element array 105-130 can be programmed with resistive values corresponding to an array of weight values. Drive voltages based on a first vector can be applied to one or more of the plurality of word lines 105-110 or to one or more of the plurality of bit lines 115-120. One or more node sense signals 140 can select one or more of the bit lines 115-120 based on a second vector. A reduction 145 can be determined based on a sensed sum of the selected one or more of the plurality of bit lines. For instance, weights of a neural network can be loaded into the resistive element array 105-130. Drive voltages corresponding to a first input or intermediate Feature Map (FM) can then be applied to the word lines 105-110 and a second input or intermediate Feature Map (FM) can be applied to the one or more node sense signals 140 to select one or more of the plurality of bit lines 105-110. A reduction 145 can be determined based on a sensed sum of the selected one or more of the plurality of bit lines 115-120. Accordingly, VVDPs can be performed directly in the computing device programmable media without having to move data between memory and a processing unit of a computing system.

Figure 2:
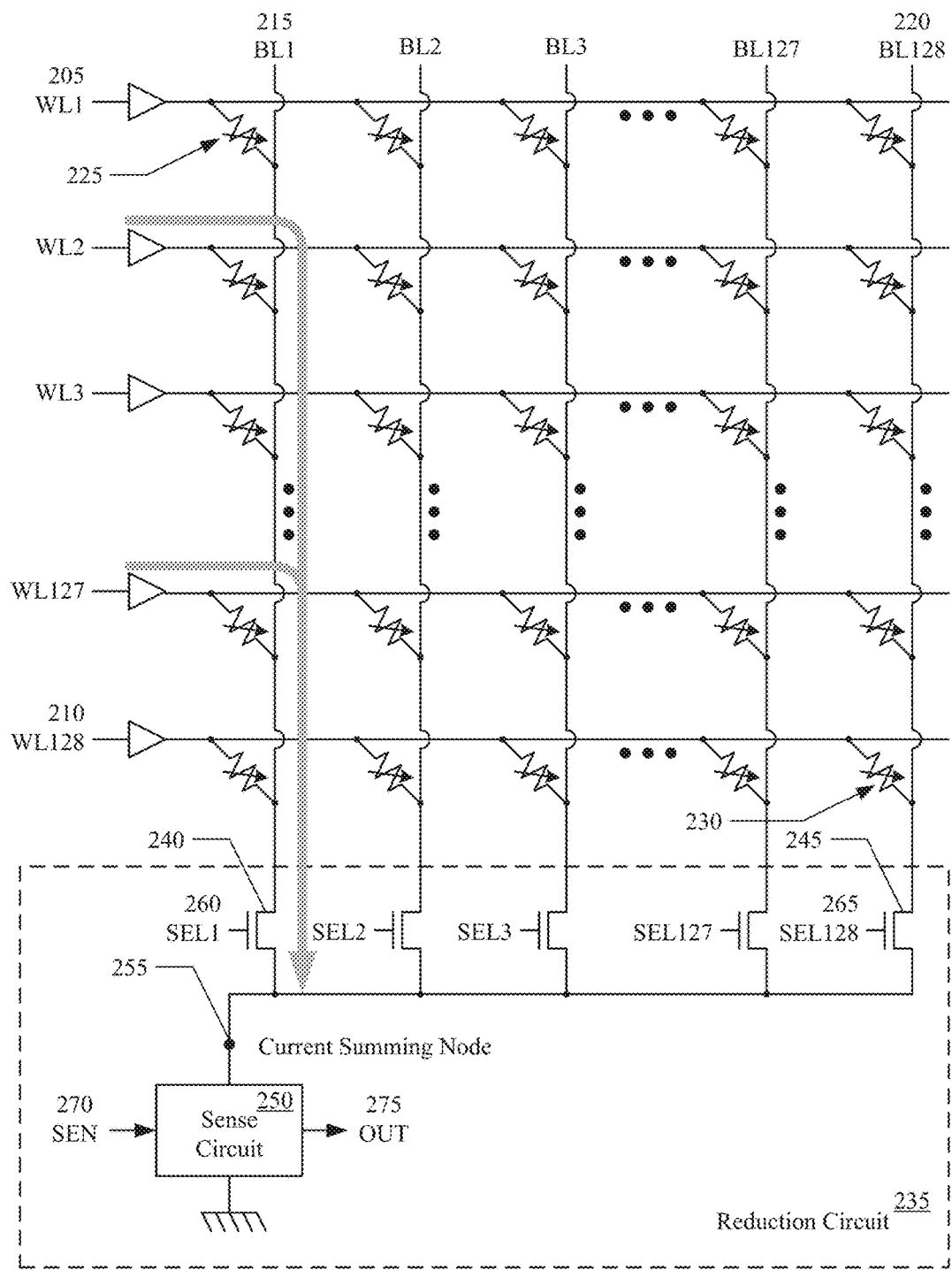
FIG. 2 is a diagram illustrating a computing device readable media in accordance with another example.

FIG. 2 is a diagram illustrating a computing device readable media in accordance with another example. Again, the computing device readable media may be a separate apparatus or integral to another device or system. The computing device readable media can include a resistive element array 205-230 and a reduction circuit 235. The resistive element array can include a plurality of word lines 205-210, a plurality of bit lines 215-220 and a plurality of programmable resistive elements 225-230 coupled between the plurality of word lines 205-210 and the plurality of bit lines 215-220.

In one implementation, the resistive element array can be a Single Level Cell (SLC) that can store one bit of data, or a Multi-Level Cell (MLC) that can store two or more bits of data. In one implementation, the resistive element array can be a resistive cell array, a phase change cell array, a phase change cell array and stackable cross-gridded data access array, a magnetoresistive cell array, a spin torque magnetoresistive cell array, or the like.

The reduction circuit 235 can include a plurality of bit line select elements 240-245 and a sense circuit 250. The plurality of bit line select elements can be configured to couple one or more of the plurality of bit lines 215-220 to a current summing node 255 in response to one or more bit line select signals 260-265. In one implementation, the plurality of bit line select elements 240-245 can include a plurality of Metal Oxide Semiconductor Field Effect Transistors (MOSFET), wherein the gates of the MOSFETs can be coupled to the plurality bit line sense signals 260-265, and the sources and drains of the MOSFETs can be coupled between the plurality of bit lines 215-220 and the current summing node 255. Each respective one of the plurality of MOSFETs can be configured to couple a respective one of the plurality of bit lines 215-220 to the current summing node 255 in response to a respective one of the plurality of bit line select signals 260-265.

The sense circuit 250 can be coupled to the current summing node 255 and configured to sense a parameter of the current summing node 255 in response to the one or more node sense signals 270. In one implementation, the computing device programmable media can be utilized to compute reductions of Vector-Vector Dot-Products (VVDP). The resistive element array 205-230 can be programmed with resistive values corresponding to an array of weight values. Drive voltages based on a first vector can be applied to one or more of the plurality of word lines 205-210, and one or more node bit line select elements 240-245 can select one or more of the bit lines 215-220 based on a second vector. A reduction 275 can be determined as an output based on a sensed sum by the sense circuit 250 of the selected one or more of the plurality of bit lines 215-220. For instance, weights of a neural network can be loaded into the resistive element array 205-230. Drive voltages corresponding to a first input or intermediate Feature Map (FM) can then be applied to the word lines and a second input or intermediate Feature Map (FM) can be applied to the one or more sense signals to select one or more of the plurality of bit lines. For example, a drive voltage $V_2$ corresponding to a FM value $X_2$ can be applied to word lines WL2 and a drive voltage $V_{127}$ corresponding to a FM value $X_{127}$ can be applied to word line WL127, and bias voltages can be applied to bit line BL1 selected by select elements SEL1. A reduction can be determined based on a sensed sum of the selected one or more of the plurality of bit lines. For example, the current flowing in bit line BL1 can be $$V_2 \times G_{2-1} + V_{127} \times G_{127-1} = X_2 \times W_{2-1} + X_{127} \times W_{127-1}$$

wherein $G_{i-j}$ is the conductance of the resistive element at row i and column j, and $W_{i-j}$ is the inverse of the conductance. Accordingly, reductions of VVDPs can be performed directly in the computing device programmable media without having to move data between memory and a processing unit of a computing system. In one aspect, multiple bit lines in the resistive element array 205-230 can be selected simultaneously to produce multiple VVDPs and by coupling the selected bit lines together, their currents add up to perform the reduction operation. The reductions can be used for normalization of VVDPs.

Figure 3:
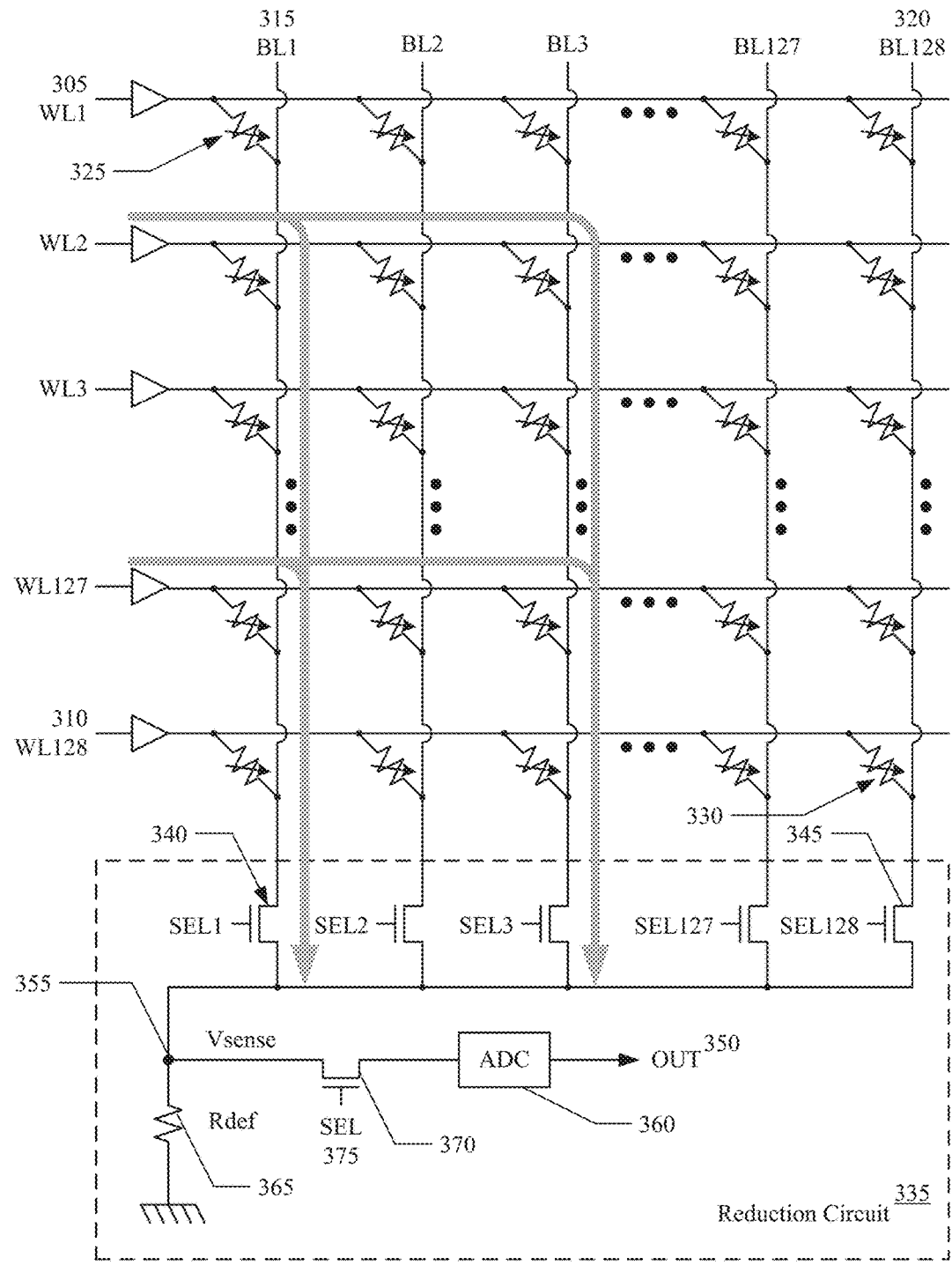
FIG. 3 is a diagram illustrating a computing device programmable media in accordance with another example.

FIG. 3 is a diagram illustrating a computing device programmable media in accordance with another example. Again, the computing device programmable media may be a separate apparatus or integral to another device or system. In one implementation, the computing device programmable media can be implemented within a computing device readable memory, such as Random-Access Memory (RAM). In another implementation, the computing device programmable media can be implemented within a computing device accelerator, such as a Vector-Vector Dot-Product (VVDP) reduction accelerator. In another implementation, the computing device programmable media can be implemented as a separate subsystem for use in or by an accelerator, processor, graphics processor or other similar subsystem of a computing system.

The computing device readable media can include a resistive element array 305-330 and a reduction circuit 335. The resistive element array can include a plurality of word lines 305-310, a plurality of bit lines 315-320 and a plurality of programmable resistive elements 325-330 coupled between the plurality of word lines 305-310 and the plurality of bit lines 315-320.

In one implementation, the resistive element array can be a Single Level Cell (SLC) that can store one bit of data, or a Multi-Level Cell (MLC) that can store two or more bits of data. In one implementation, the resistive element array can be a resistive cell array, a phase change cell array, a phase change cell array and stackable cross-gridded data access array, a magnetoresistive cell array, a spin torque magnetoresistive cell array, or the like.

The reduction circuit 335 can include a plurality of bit line select elements 340-345, and a sense circuit 360-370. In various aspect, the sense circuit 360-370 can be a more detailed implementation of the sense circuit 250 from FIG. 2. The sense circuit 360-370 can be configured to output a reduction value 350 based on a sense parameter at a current summing node 355. In one implementation, the sense circuit can include a voltage sense amplifier configured to measure a voltage proportional to the current flowing through the current summing node 355. In another implementation, the sense circuit can include a current sense amplifier configured to measure the current flowing through the current summing node 355. In another implementation, the sense circuit can include an Analog-to-Digital Converter (ADC) 360, a resistive element 365 and a sense gate 370. The resistive element 365 can be coupled between the current summing node 355 and a ground potential. The sense gate 370 can be coupled between the current summing node 355 and the ADC 360. The sense gate 370 can be configured to couple the current summing node 355 to the ADC 360 in response to a node sense signal 375. In one implementation, the sense gate 370 can include a MOSFET including a gate coupled to the node sense signal 375, and a source and drain coupled between the current summing node 355 and the ADC 360. The ADC 360 can be configured to sense an analog voltage value across the resistive element 365 which is proportional to the current flowing through the current summing node 355 and output a digital voltage value as the reduction value 350.

In one implementation, the computing device programmable media can be utilized to computer reductions of Vector-Vector Dot-Products (VVDP). The resistive element array 305-330 can be programmed with resistive values corresponding to an array of weight values. Drive voltages based on a first vector can be applied to one or more of the plurality of word lines 305-310, and one or more node sense signals 340-345 can select one or more of the bit lines 315-320 based on a second vector. A reduction can be determined based on a sensed sum of the selected one or more of the plurality of bit lines 315-320. For instance, weights of a neural network can be loaded into the resistive element array 305-330. Drive voltages corresponding to a first input or intermediate Feature Map (FM) can then be applied to the word lines 305-310 and a second input or intermediate FM can be applied to the one or more sense signals to select one or more of the plurality of bit lines 315-320. For example, a drive voltage $V_2$ corresponding to a FM value $X_2$ can be applied to word lines WL1 and a drive voltage $V_{127}$ corresponding to a FM value $X_{127}$ can be applied to word line WL127, and bias voltages can be applied to bit lines BL1 and BL3 selected by select elements SEL1 SEL3. A reduction can be determined based on a sensed sum of the selected one or more of the plurality of bit lines. For example, the current flowing in bit line BL1 can be the sum of $I_{1-2}$ and $I_{1-127}$, where $$I_{1-2}=V_2 \times G_{2-1}=X_2 \times W_{2-1}$$

and $$I_{1-127}=V_{127} \times G_{127-1}=X_{127} \times W_{127-1},$$

therefore $$I_1=X_2 \times W_{2-1}+X_{127} \times W_{127-1}.$$

Similarly $$I_3=X_2 \times W_{2-3}+X_{127} \times W_{127-3}.$$

The current flowing through the sense node 355 can be $I_1+I_3$, that in turn generates a voltage Vsense=Rdef×($I_1+I_3$) across the resistive element 365. The voltage across the resistive element 365 can be sampled by the ADC 360 in response to a node sense signal 375 at the sense gate 370. The summed currents flowing through the sense node 355 represents the reduction of two VVDPs. The selection of even more bit lines 315-320 can be utilized to perform even wider reductions.

Accordingly, reductions of one or more VVDPs can be performed directly in the computing device programmable media without having to move data between memory and a processing unit of a computing system. In one aspect, multiple bit lines in the resistive element array 305-330 can be selected simultaneously to produce multiple VVDPs and by coupling the selected bit lines together, their currents add up to perform the reduction operation. The reductions can be used for normalization of VVDPs.

Figure 4:
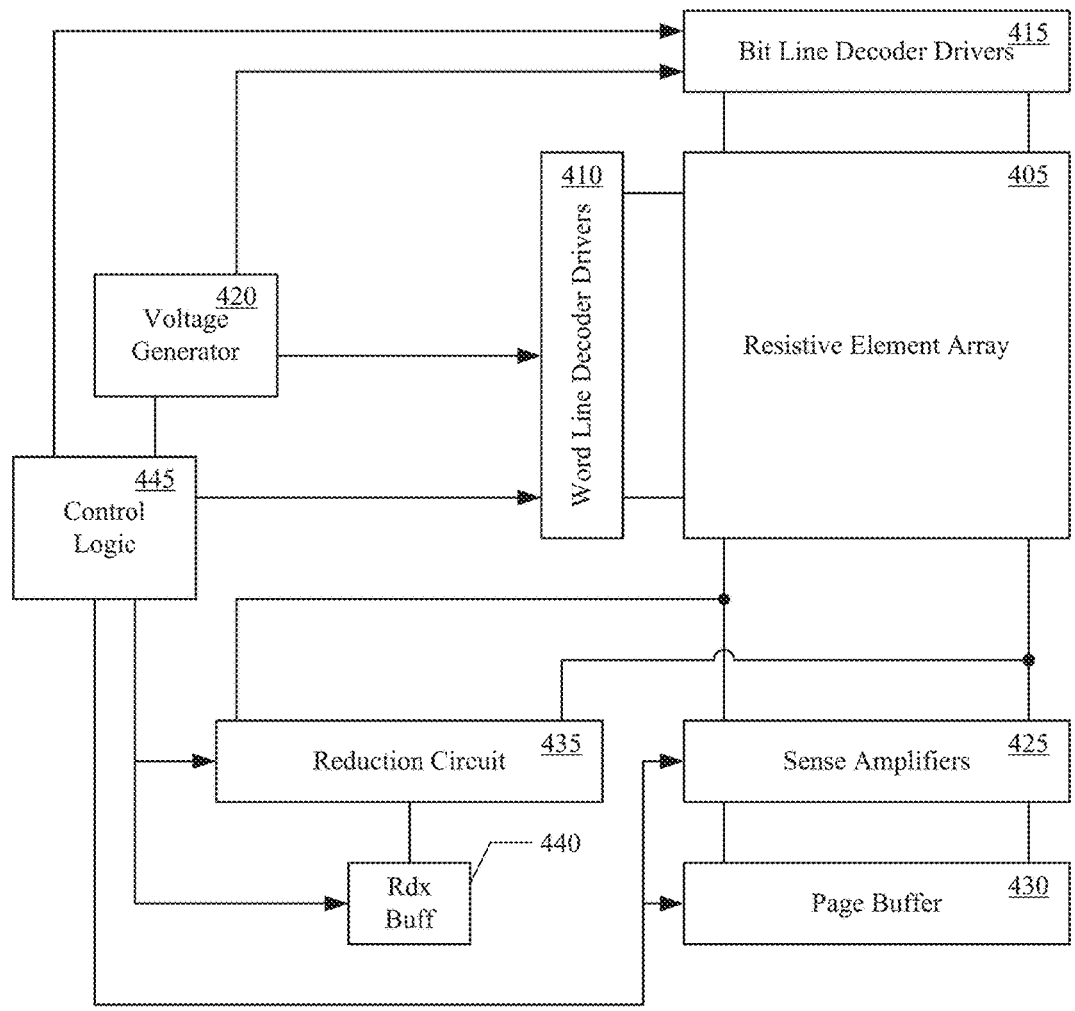
FIG. 4 is a diagram illustrating a computing device programmable media in accordance with another example.

FIG. 4 is a diagram illustrating a computing device programmable media in accordance with an example. Again, the computing device programmable media may be a separate apparatus such as an accelerator or integral to another device or system such as a Random-Access Memory (RAM). The computing device readable media can include a resistive element array 405, a word line decoder driver circuit 410, a bit line decoder driver circuit 415, a voltage generator circuit 420, a sense amplifier circuit 425, a page buffer circuit 430, a reduction circuit 435, a reduction buffer circuit 440 and control logic circuit 445.

The resistive element array 405 can include a plurality of word lines, a plurality of bit lines and a plurality of programmable resistive elements coupled between the plurality of word lines and the plurality of bit lines, as described above with respect to FIGS. 1-3.

The word line decoder driver circuit 410 and bit line decoder driver circuit 415 can, under control of the control logic 445, decode an address and drive the appropriate word line and bit lines to program a state of resistive element memory cells. The voltage generator circuit 420 can provide appropriate voltage biases to the word line decoder driver circuit 410 and bit line decoder driver circuit 415 for programming cells in the resistive element array 405. For example, the resistive element array 405 can be driven with appropriate voltages to program the resistive elements with values corresponding to an array of weight values, as described above with respect to FIGS. 1-3. Similarly, the word line decoder driver circuit 410 can drive select word lines based on a first vector, the bit line decoder driver circuit 415 can drive the bit lines, and the reduction circuit 435 can select one or more of the bit lines based on a second vector to determine a reduction, as described above with respect to FIGS. 1-3.

In one or more implementations, the resistive element array 405, the word line decoder driver circuit 410, the bit line decoder driver circuit 415, the voltage generator circuit 420, the sense amplifier circuit 425, the page buffer circuit 430, and the control logic circuit 445 can also operate in accordance with a conventional Resistive Random Access Memory (ReRAM), a Phase Change Memory (PCM), a phase change cell array and stackable cross-gridded data access array (3D XPoint), a Magnetoresistive Random Access Memory (MRAM), a Spin Torque Magnetoresistive Random Access Memory (ST-MRAM), or the like.

Figure 5:
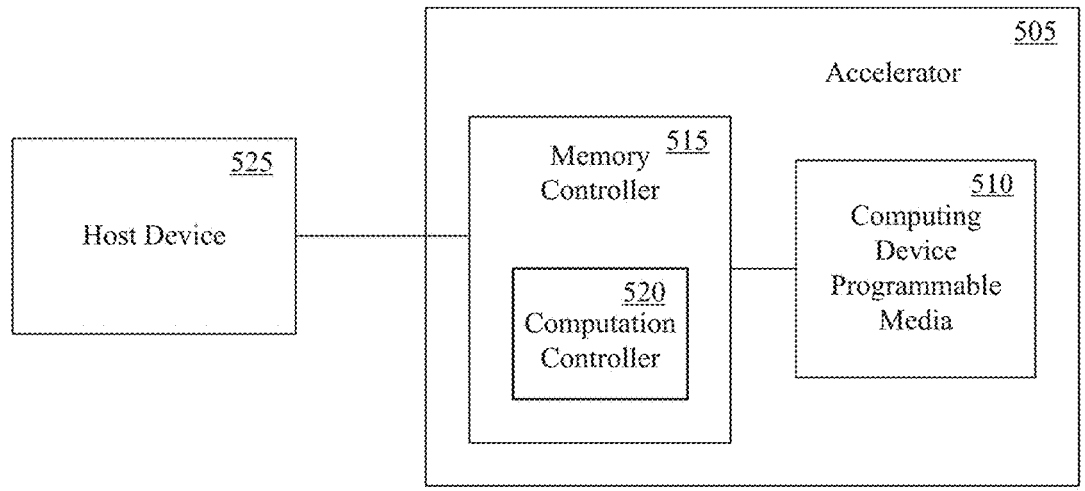
FIG. 5 is a diagram illustrating an accelerator in accordance with an example.

FIG. 5 is a diagram illustrating an accelerator in accordance with an example. The accelerator 505 can include a computing device programmable media 510, a memory controller 515, and a computation controller 520. The accelerator 505 can be communicatively coupled to a host computing device 525. The computing device programmable media 510 can operate to perform reductions of Vector-Vector Dot-Products (VVDP) as described above with respect to FIGS. 1-4.

In one aspect, the memory controller 515 can receive VVDP requests from the host device 525. The memory controller 515 can be configured to manage the flow of data going to and from the computing device programmable media. The computation controller 520 can be configured to control a reduction circuit of the computing device programmable media 510 to select one or more of a plurality of bit lines and sense a sum of the selected one or more of the plurality of bit lines.

Figure 6:
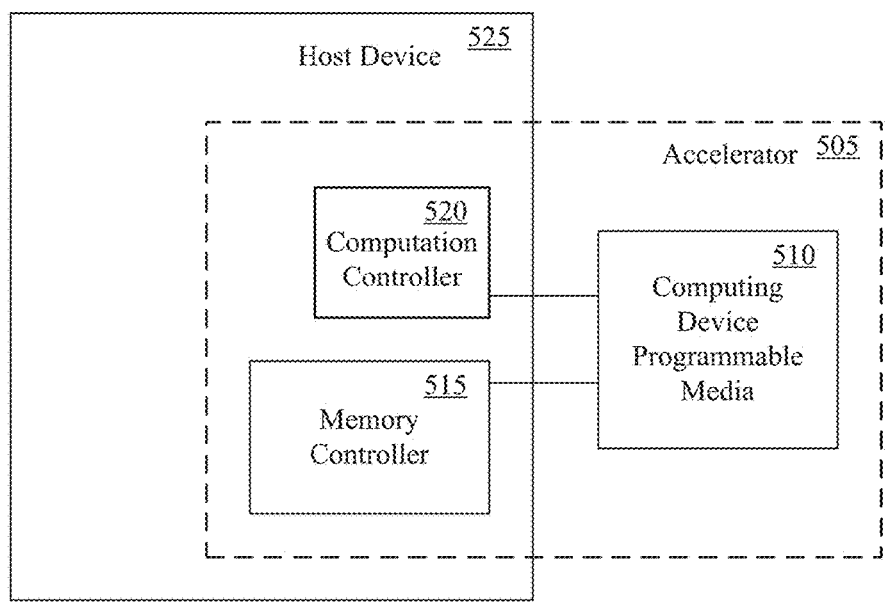
FIG. 6 is a diagram illustrating an accelerator in accordance with an example.

In one implementation, the accelerator 505 can be separate from the host device 525 as illustrated in FIG. 5. In another implementation, one or more subsystems can be shared between the accelerator 505 and the host device 525, as illustrated in FIG. 6. In such case, one or more portions of the accelerator 505 may be implemented separate from the host device 525, while one or more other portions of the accelerator 505 may be integral to the host device 525. Likewise, one or more portions of the accelerator 505 may be implemented separately or integral to one or more other portions of the accelerator 505. For example, the computation controller 520 can be integral to the memory controller 515 or computing device programmable media 510, or the computation controller 520 can be implemented as a separate portion of the accelerator 505. In addition, one or more sub-systems may be dedicated to implementing the accelerator 505. In other cases, one or more sub-systems may be used in the implementation of the accelerator 505 and used in other sub-systems of the host device 525. For example, the memory controller 515 of the host device 525 may be utilized to read and write data to memory, such as RAM, in the host device 525 and to also manage the flow of data going to and from the computing device programmable media 510 of the accelerator 505. In yet another implementation, the accelerator 505 may be integral to the host device 525 as illustrated in FIG. 7.

Figure 7:
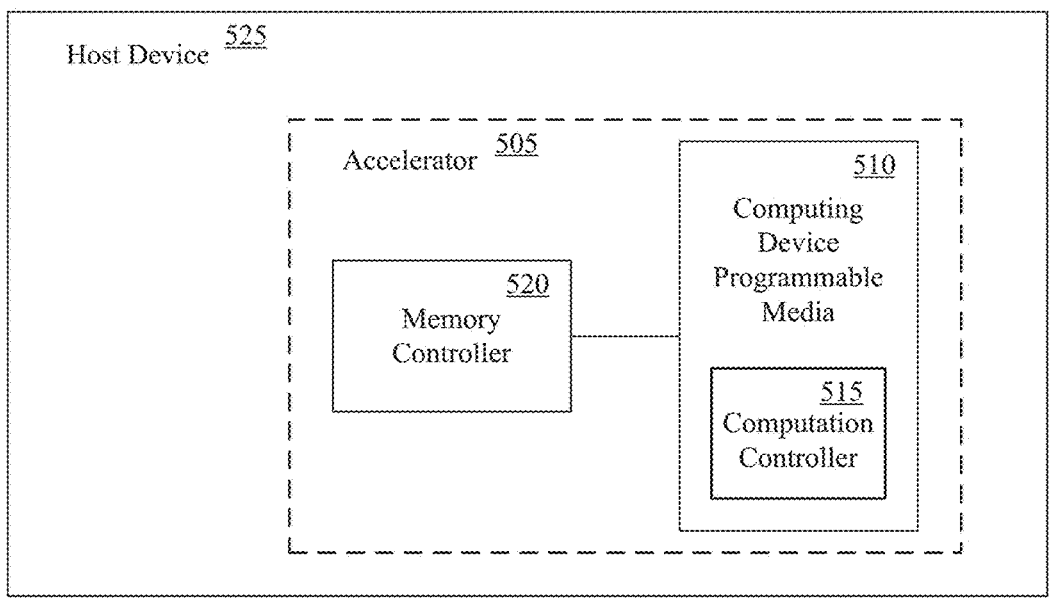
FIG. 7 is a diagram illustrating an accelerator in accordance with an example.

The host computing devices and accelerators of FIGS. 5-7 are illustrative of exemplary embodiments, and are not intended to limit the scope of the present technology. The accelerator devices and methods described herein can be readily applied to any number of conventional host computing devices, along with computing systems to be developed in the future.

Embodiments of the present technology can advantageously be utilized in machine learning applications to computer reductions of Vector-Vector Dot-Products (VVDP). Embodiments can be implemented as a dedicated accelerator, or may be implemented as a combination of an accelerator and computer memory. Embodiments advantageously provide a reduction circuit that can select one or more subarrays to produce one or more VVDPs that can be summed in the analog domain to perform a reduction operation on the one or more VVDPs. In contrast, the conventional art converts individual VVDP from the analog to digital domain, by means of an analog-to-digital converter, and computing the reduction in the digital domain, by means of digital adders in a processing unit.

EXAMPLES

The following examples pertain to specific technology embodiments and point out specific features, elements, or steps that may be used or otherwise combined in achieving such embodiments.

Example 1 includes an apparatus comprising: a resistive element array, including a plurality of word lines, a plurality of bit lines, and a plurality of programmable resistive elements coupled between the plurality of word lines and the plurality of bit lines; a plurality of bit line select elements configured to couple one or more of the plurality of bit lines to a current summing node in response to one or more of a plurality bit line select signals; and a sense circuit coupled to the current summing node, wherein the sense circuit is configured to sense a parameter of the current summing node in response to a node sense signal.

Example 2 includes the apparatus of Example 1, wherein the resistive element array comprises a plurality of multi-level cells (MLC).

Example 3 includes the apparatus of Example 1, wherein the resistive element array comprises a resistive cell array.

Example 4 includes the apparatus of Example 1, wherein the resistive element array comprises a phase change cell array.

Example 5 includes the apparatus of Example 1, wherein the resistive element array comprises a phase change cell array and a stackable cross-gridded data access array.

Example 6 includes the apparatus of Example 1, wherein the resistive element array comprises a spin torque magnetoresistive cell array.

Example 7 includes the apparatus of Example 1, wherein the plurality of bit line select elements comprise a plurality of Metal Oxide Semiconductor Field Effect Transistors (MOSFET), wherein gates of the MOSFETs are coupled to the plurality bit line select signals, and sources and drains of the MOSFETs are coupled between the plurality of bit lines and the current summing node.

Example 8 includes the apparatus of Example 7, wherein each respective one of the plurality of MOSFETs is configured to couple a respective one of the plurality of bit lines to the current summing node in response to a respective one of the plurality of bit line select signals.

Example 9 includes the apparatus of Example 1, wherein the sense circuit includes a voltage sense amplifier.

Example 10 includes the apparatus of Example 1, wherein the sense circuit includes a current sense amplifier.

Example 11 includes the apparatus of Example 1, wherein the sense circuit includes, an analog-to-digital converter (ADC); a resistive element coupled between the current summing node and a ground potential; and a sense gate coupled between the current summing node and the ADC and configured to couple the current summing node to the ADC in response to the node sense signal.

Example 12 includes the apparatus of Example 11, wherein the sense gate comprises a Metal Oxide Semiconductor Field Effect Transistor (MOSFET), wherein the MOSFET includes a gate coupled to the node sense signal and a source and a drain coupled between the current summing node and the ADC.

Example 13 includes the apparatus of Example 1, further comprising a word line drive circuit and a bit line driver circuit configured to set a state of the plurality of resistive elements according to a first plurality of values.

Example 14 includes the apparatus of Example 13, wherein the first plurality of values comprises values of a weight matrix.

Example 15 includes the apparatus of Example 13, further comprising the word line drive circuit configured to drive a selected one or more of the plurality of word lines with a predetermined word line drive parameter according to a second plurality of values.

Example 16 includes the apparatus of Example 15, wherein the predetermined word line drive parameter comprises a predetermined word line voltage.

Example 17 includes the apparatus of Example 15, wherein the second plurality of values comprises a first vector.

Example 18 includes the apparatus of Example 15, wherein the plurality of bit line sense signals are based on a third plurality of values.

Example 19 includes the apparatus of Example 18, wherein the third plurality of values comprise a second vector.

Example 20 includes the apparatus of Example 15, wherein the sense circuit is configured to sense a voltage of the current summing node.

Example 21 includes the apparatus of Example 15, wherein the sense circuit is configured to sense a current of the current summing node.

Example 22 includes the apparatus of Example 15, wherein, the plurality of bit line select elements couples one or more of the plurality of bit lines to the current summing node in response to the plurality bit line select signals; the word line drive circuit drives at least two of the plurality of word lines with a predetermined word line drive parameter according to a second plurality of values; and the sense circuit senses the parameter of the current summing node in response to the node sense signal.

Example 23 includes the apparatus of Example 15, wherein, the plurality of bit line select elements couple at least two of the plurality of bit lines to the current summing node in response to the plurality of bit line select signals; the word line drive circuit drives at one or more of the plurality of word lines with a predetermined word line drive parameter according to a second plurality of values; and the sense circuit senses the parameter of the current summing node in response to the node sense signal.

Example 24 includes the apparatus of Example 15, wherein the sense circuit is configured to output a reduction value based on the sensed parameter.

Example 25 includes the apparatus of Example 24, wherein outputting the reduction value includes saving the reduction value back to the resistive element array.

Example 26 includes the apparatus of Example 24, wherein outputting the reduction value includes saving the reduction value to another resistive element array.

Example 27 includes a system comprising: a resistive memory including, a resistive element array including a plurality of word lines, a plurality of bit lines, and a plurality of programmable resistive elements coupled between the plurality of word lines and the plurality of bit lines; and a reduction circuit coupled to the plurality of bit lines; and a computation controller configured to control the reduction circuit to selected one or more of a plurality of bit lines and sense a sum of the selected one or more of the plurality of bit lines.

Example 28 includes the apparatus of Example 27, wherein the computation controller is further configured to control the plurality of word lines and the plurality of bit lines to program the programmable resistive elements according to a first plurality of values.

Example 29 includes the apparatus of Example 28, wherein the computation controller is further configured to apply voltages to the plurality of word lines according to a second plurality of values.

Example 30 includes the apparatus of Example 28, wherein the computation controller is further configured to select the one or more of the plurality of bit lines according to a third plurality of values.

Example 31 includes the apparatus of Example 28, further comprising a memory controller configured to control the plurality of word lines and the plurality of bit lines to read data from the resistive memory, write data to the resistive memory and erase data from the memory.

Example 32 includes the apparatus of Example 27, further comprising a memory controller configured to control the plurality of word lines and the plurality of bit lines to program the programmable resistive elements according to a first plurality of values.

Example 33 includes the apparatus of Example 32, wherein the computation controller is further configured to apply voltages to the plurality of word lines according to a second plurality of values.

Example 34 includes the apparatus of Example 33, wherein the computation controller is further configured to select the one or more of the plurality of bit lines according to a third plurality of values.

Example 35 includes the apparatus of Example 32, wherein the memory controller is further configured to apply voltages to the plurality of word lines according to a second plurality of values.

Example 36 includes the apparatus of Example 32, wherein the memory controller is further configured to control the plurality of word lines and the plurality of bit lines to read data from the resistive memory, write data to the resistive memory and erase data from the memory.

Example 37 includes the apparatus of Examples 31 or 32, wherein the computation controller is separate from the memory controller.

Example 38 includes the apparatus of Examples 31 or 33, wherein the computation controller is integral to the memory controller.

Example 39 includes the apparatus of Examples 28 or 32, wherein the first plurality of values comprises a Neural Network Matrix (NNM).

Example 40 includes the apparatus of Examples 29 or 33, wherein the second plurality of values comprise a first input or intermediate Feature Map (FM).

Example 41 includes the apparatus of Examples 30 or 34, wherein the third plurality of values comprise a second input or intermediate Feature Map (FM).

Example 42 includes the apparatus of Example 27, wherein the sum of the selected one or more of the plurality of bit lines comprises a reduction value.

Example 43 includes the apparatus of Example 27, wherein the resistive memory comprises a Resistive Random-Access Memory (ReRAM).

Example 44 includes the apparatus of Example 27, wherein the resistive memory comprises a Phase Change Random-Access Memory (PC-RAM).

Example 45 includes the apparatus of Example 27, wherein the resistive memory comprises a Spin Torque Magnetoresistive Random-Access Memory (ST-MRAM).

Example 46 includes the apparatus of Example 27, further comprising an accelerator including the resistive memory and the computation controller.

Example 47 includes the apparatus of Example 46, further comprising a host device coupled to the accelerator.

Example 48 includes the apparatus of Example 27, wherein the reduction circuit comprises: a bit line select circuit coupled between the plurality of bit lines and a current summing node, wherein the bit line select circuit is configured to couple one or more of the bit lines to the current summing node in response to one or more of a plurality bit line select signals from the computation controller; and a sense circuit coupled to the current summing node, wherein the sense circuit is configured to sense a parameter of the current summing node in response to a node sense signal from the computation controller and output a reduction value based on the sensed parameter to the memory computation controller.

Example 49 includes a method of calculating a reduction of a Vector-Vector Dot-Product (VVDP) comprising: programming a resistive element array based on values of a weight matrix; applying voltages to one or more of a plurality of word lines of the resistive element array based on values of a first vector; sensing a sum of a selected one or more of a plurality of bit lines of the resistive element array based on values of a second vector; and outputting a reduction value based on the sensed sum of the selected one or more of the plurality of bit lines.

Example 50 includes the apparatus of Example 49, wherein the weight matrix comprises a Neural Network Matrix (NNM).

Example 51 includes the apparatus of Example 49, wherein the first and second vector comprises an input or intermediate Feature Map (FM).

Example 52 includes the apparatus of Example 49, wherein sensing the sum of the selected one or more of a plurality of bit lines comprises: coupling the selected one or more of a plurality of bit lines to a current summing node in response to one or more of a plurality of bit line select signals; sensing a parameter of the current summing node in response to a node sense signal; and converting the sensed parameter to the reduction value.

Example 53 includes the apparatus of Example 49, wherein the reduction value becomes a value of a second weight matrix.

Example 54 includes the apparatus of Example 53, further comprising: programming the resistive element array based on values of the second weight matrix; applying voltages to one or more of the plurality of word lines of the resistive element array based on values of a third vector; sensing a sum of a selected one or more of the plurality of bit lines of the resistive element array based on values of a fourth vector; and outputting a second reduction value based on the sensed sum of the selected one or more of the plurality of bit lines.

Example 55 includes the apparatus of Example 53, further comprising: programming a second resistive element array based on values of the second weight matrix; applying voltages to one or more of a plurality of word lines of the second resistive element array based on values of a third vector; sensing a sum of a selected one or more of a plurality of bit lines of the second resistive element array based on values of a fourth vector; and outputting a second reduction value based on the sensed sum of the selected one or more of the plurality of bit lines of the second resistive element array.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. An apparatus comprising:
   a resistive element array, including a plurality of word lines, a plurality of bit lines, and a plurality of programmable resistive elements coupled between the plurality of word lines and the plurality of bit lines;
   a plurality of bit line select elements configured to couple one or more of the plurality of bit lines to a current summing node in response to one or more of a plurality bit line select signals; and
   a sense circuit coupled to the current summing node, wherein the sense circuit is configured to sense a parameter of the current summing node in response to a node sense signal.

2. The apparatus of claim 1, wherein the resistive element array comprises a plurality of multi-level cells (MLC).

3. The apparatus of claim 1, wherein the resistive element array comprises a phase change cell array.

4. The apparatus of claim 1, wherein the plurality of bit line select elements comprise a plurality of Metal Oxide Semiconductor Field Effect Transistors (MOSFET), wherein gates of the MOSFETs are coupled to the plurality bit line select signals, and sources and drains of the MOSFETs are coupled between the plurality of bit lines and the current summing node.

5. The apparatus of claim 4, wherein each respective one of the plurality of MOSFETs is configured to couple a respective one of the plurality of bit lines to the current summing node in response to a respective one of the plurality of bit line select signals.

6. The apparatus of claim 1, wherein the sense circuit comprises,
   an analog-to-digital converter (ADC);
   a resistive element coupled between the current summing node and a ground potential; and
   a sense gate coupled between the current summing node and the ADC and configured to couple the current summing node to the ADC in response to the node sense signal.

7. The apparatus of claim 6, wherein the sense gate comprises a Metal Oxide Semiconductor Field Effect Transistor (MOSFET), wherein the MOSFET includes a gate coupled to the node sense signal and a source and a drain coupled between the current summing node and the ADC.

8. The apparatus of claim 1, further comprising a word line drive circuit and a bit line driver circuit configured to set a state of the plurality of programmable resistive elements according to a first plurality of values.

9. The apparatus of claim 8, further comprising the word line drive circuit configured to drive a selected one or more of the plurality of word lines with a predetermined word line drive parameter according to a second plurality of values.

10. The apparatus of claim 9, wherein,
    the plurality of bit line select elements couples one or more of the plurality of bit lines to the current summing node in response to the plurality bit line select signals;
    the word line drive circuit drives at least two of the plurality of word lines with a predetermined word line drive parameter according to a second plurality of values; and
    the sense circuit senses the parameter of the current summing node in response to the node sense signal.

11. The apparatus of claim 9, wherein,
    the plurality of bit line select elements couple at least two of the plurality of bit lines to the current summing node in response to the plurality of bit line select signals;
    the word line drive circuit drives at one or more of the plurality of word lines with a predetermined word line drive parameter according to a second plurality of values; and
    the sense circuit senses the parameter of the current summing node in response to the node sense signal.

12. The apparatus of claim 9, wherein the sense circuit is configured to output a reduction value based on the sensed parameter.

13. The apparatus of claim 12, wherein outputting the reduction value includes saving the reduction value back to the resistive element array or saving the reduction value to another resistive element array.

14. A system comprising:
    a resistive memory including;
       a resistive element array including a plurality of word lines, a plurality of bit lines, and a plurality of programmable resistive elements coupled between the plurality of word lines and the plurality of bit lines; and
       a reduction circuit coupled to the plurality of bit lines; and
    a computation controller configured to control the reduction circuit to selected one or more of a plurality of bit lines and sense a sum of the selected one or more of the plurality of bit lines.

15. The system of claim 14, wherein the computation controller is further configured to control the plurality of word lines and the plurality of bit lines to program the programmable resistive elements according to a first plurality of values.

16. The system of claim 15, wherein the computation controller is further configured to apply voltages to the plurality of word lines according to a second plurality of values.

17. The system of claim 15, wherein the computation controller is further configured to select the one or more of the plurality of bit lines according to a third plurality of values.

18. The system of claim 14, wherein the reduction circuit comprises:
    a bit line select circuit coupled between the plurality of bit lines and a current summing node, wherein the bit line select circuit is configured to couple one or more of the plurality of bit lines to the current summing node in response to one or more of a plurality bit line select signals from the computation controller; and a sense circuit coupled to the current summing node, wherein the sense circuit is configured to sense a parameter of the current summing node in response to a node sense signal from the computation controller and output a reduction value based on the sensed parameter to the computation controller.

19. A method of calculating a reduction of a Vector-Vector Dot-Product (VVDP) comprising:
   programming a resistive element array based on values of a weight matrix;
   applying voltages to one or more of a plurality of word lines of the resistive element array based on values of a first vector;
   sensing a sum of a selected one or more of a plurality of bit lines of the resistive element array based on values of a second vector; and
   outputting a reduction value based on the sensed sum of the selected one or more of the plurality of bit lines.

20. The method according to claim 19, wherein the weight matrix comprises a Neural Network Matrix (NNM).

21. The method according to claim 19, wherein the first and second vector comprises an input from an intermediate Feature Map (FM).

22. The method according to claim 19, wherein sensing the sum of the selected one or more of a plurality of bit lines comprises:
   coupling the selected one or more of a plurality of bit lines to a current summing node in response to one or more of a plurality of bit line select signals;
   sensing a parameter of the current summing node in response to a node sense signal; and
   converting the sensed parameter to the reduction value.

23. The method according to claim 19, wherein the reduction value becomes a value of a second weight matrix.

24. The method according to claim 23, further comprising:
   programming the resistive element array based on values of the second weight matrix;
   applying voltages to one or more of the plurality of word lines of the resistive element array based on values of a third vector;
   sensing a sum of a selected one or more of the plurality of bit lines of the resistive element array based on values of a fourth vector; and
   outputting a second reduction value based on the sensed sum of the selected one or more of the plurality of bit lines.

25. The method according to claim 23, further comprising:
   programming a second resistive element array based on values of the second weight matrix;
   applying voltages to one or more of a plurality of word lines of the second resistive element array based on values of a third vector;
   sensing a sum of a selected one or more of a plurality of bit lines of the second resistive element array based on values of a fourth vector; and
   outputting a second reduction value based on the sensed sum of the selected one or more of the plurality of bit lines of the second resistive element array.

* * * * *